US007603603B2

United States Patent
Dubey (10) Patent No.: US 7,603,603 B2
(45) Date of Patent: Oct. 13, 2009

(54) CONFIGURABLE MEMORY ARCHITECTURE WITH BUILT-IN TESTING MECHANISM

(75) Inventor: Prashant Dubey, Ghazibad (IN)

(73) Assignee: STMicroelectronics PVT. Ltd., Noida (IN)

( * ) Notice: Subject to any disclaimer, the term of this patent is extended or adjusted under 35 U.S.C. 154(b) by 430 days.

(21) Appl. No.: 11/441,815

(22) Filed: May 26, 2006

(65) Prior Publication Data

US 2007/0016826 A1    Jan. 18, 2007

(30) Foreign Application Priority Data

May 31, 2005    (IN)    .................. 1405/DEL/2005

(51) Int. Cl.
*G01R 31/28*    (2006.01)
*G11C 29/00*    (2006.01)
*G01R 31/26*    (2006.01)

(52) U.S. Cl. .................. 714/738; 714/724; 714/720; 714/718; 324/765; 365/201

(58) Field of Classification Search .................. None
See application file for complete search history.

(56) References Cited

U.S. PATENT DOCUMENTS

| 6,297,997 | B1 * | 10/2001 | Ohtani et al. ................ 365/201 |
| 6,826,101 | B2 * | 11/2004 | Fukuyama .................. 365/201 |
| 6,912,166 | B2 * | 6/2005 | Kawai et al. ................ 365/201 |
| 7,111,190 | B2 * | 9/2006 | Venkatraman et al. ......... 714/6 |
| 7,225,379 | B2 * | 5/2007 | Yonaga ....................... 714/744 |
| 2002/0120826 | A1 * | 8/2002 | Venkatraman et al. ...... 711/207 |
| 2004/0123200 | A1 * | 6/2004 | Caty et al. .................. 714/733 |
| 2004/0130959 | A1 * | 7/2004 | Kawaguchi ................. 365/222 |
| 2004/0190352 | A1 * | 9/2004 | Watanabe et al. ........... 365/191 |
| 2005/0097418 | A1 * | 5/2005 | Anzou et al. ................ 714/733 |
| 2006/0010335 | A1 * | 1/2006 | Venkatraman et al. ......... 714/3 |

* cited by examiner

*Primary Examiner*—Kevin L Ellis
*Assistant Examiner*—Guerrier Merant
(74) *Attorney, Agent, or Firm*—Gardere Wynne Sewell LLP (57) ABSTRACT

A configurable memory architecture includes a built-in testing mechanism integrated in said memory to support very efficient built-in self-test in Random Access Memories (RAMs) with greatly reduced overhead, in terms of area and speed. Memories can fail at high speed due to glitches (unwanted pulses which can at times behave as invalid clocks and destroy the functionality of synchronous systems) produced in decoding, the slow precharge of bitlines or the slow sensing of the sense amplifiers. The memory architecture incorporates structured DFT techniques to separately detect these failures.

27 Claims, 6 Drawing Sheets

CONFIGURABLE MEMORY ARCHITECTURE WITH BUILT-IN TESTING MECHANISM

PRIORITY CLAIM

The present application claims priority from Indian Patent Application No. 1405/Del/2005 filed May 31, 2005, the disclosure of which is hereby incorporated by reference.

BACKGROUND OF THE INVENTION

Technical Field of the Invention

The present invention relates to a configurable memory architecture with a built-in testing mechanism integrated in a memory core.

Description of Related Art

Technology trends in semiconductor memories follow MOORE's Law and thus every year circuit geometries shrink by roughly a factor of 1.5. Memories are also increasingly used as embedded structures in Application Specific Integrated Circuits (ASICs).

Today's embedded memories are full custom volatile/non-volatile memories that are designed and optimized for high speed, low power and small area. There are two types of embedded memories: synchronous and asynchronous. The operations inside the asynchronous memories are not synchronized to a clock. On the contrary, synchronous memories work on the edge of the clock. Also, volatile memories can be divided based upon the nature of the storage element and detection techniques, into two categories namely: Static Random Access Memories (SRAMs) and Dynamic Random Access Memories (DRAMs). SRAMs contain storage elements that retain the values stored in them until either power is removed or the data is over written. DRAMs on the other hand contain storage elements that require dynamic refreshing at regular intervals to retain the value stored therein. In the present discussion the focus is on synchronous single port SRAMs and DRAMs. Nevertheless, the same fundamentals can also be applied to asynchronous memories.

Figure 1:
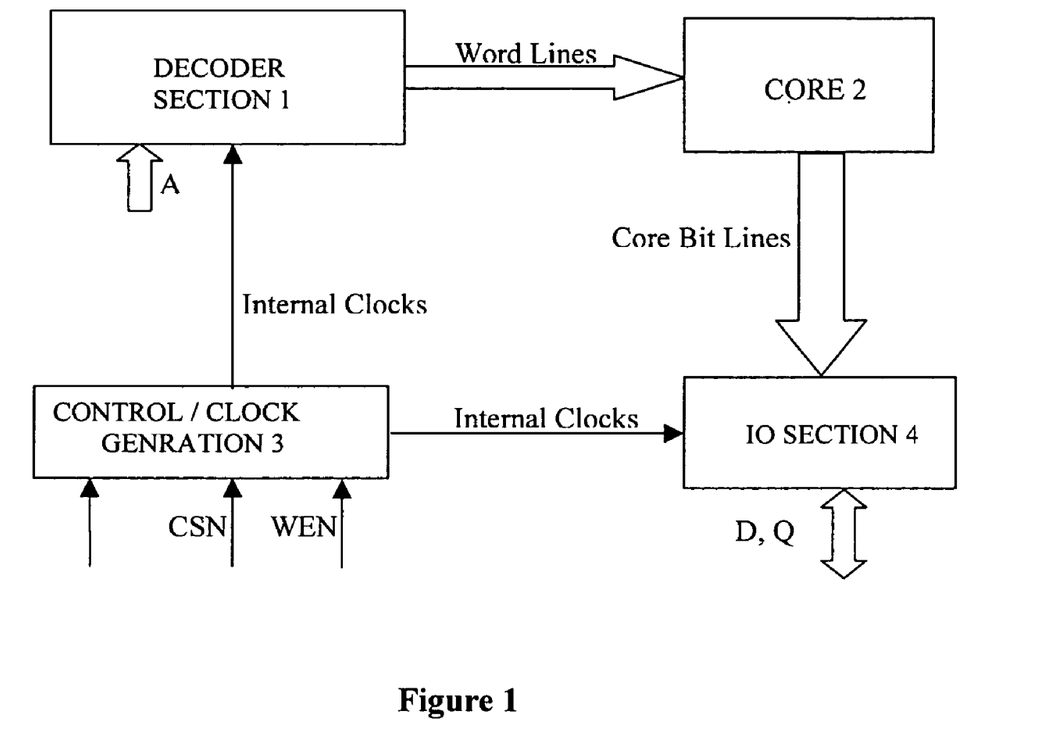
FIG. 1 shows the conventional single port memory.

A typical memory contains a data input port, an address port, a clock, a memory select port, an output enable port, a write enable port and an output port. The block diagram of a RAM is shown in the FIG. 1. It contains a decoder section 1, a core section 2, an I/O section 4 and control/clock generation section 3.

Various blocks like an X Decoder, Y Decoder, Pre-Decoder, Core, I/O's/Precharge/Read/Write Logic, Clock Generation Circuits, Dummy Paths, Refresh Logic and Pipe Lines are made in the form of leaf cells that are abutted to form a memory block of a desired "word x bit" configuration. The full memory development thus pertains to making these leaf cells with a new technology and tuning them according to the full range of words and bits provided. The normal decoder of the memory contains the latches to latch the address inputs. The addresses are statically decoded and the valid decoded value is clocked to finally select a row or column (or both) to write into or read from the respective cells. In the case of dynamic decoders the row select signal, called the "wordline," is subjected to a precharge mechanism using an internally generated memory clock. The write unit of the Memory can be as simple as a latch to store the value at the data input port on the positive edge of the clock, and a strong buffer to pull the column select (architecture specific) signal or the bitline, to the latched value. The DRAM write involves a more complex structure as the data to be written on a row is first copied onto a row register and then written. Periodic refresh cycles are simply read-write operations to the DRAM memory cell. The read circuit can be as simple as a digital inverter to sense the discharge of the precharge of the bitline or as complex as a differential/latch type, single/double ended sense amplifier which is analog in nature. For a DRAM, the process of reading is complex since the read is destructive. In this case again a latch can be used to hold the value read out from the memory in a particular cycle, until the next operation at the next positive edge of the memory clock. The core can be a group of cells, which can be single latches, or six, four, eight transistor complex latches or a capacitor.

Testing of the embedded RAMs is increasingly becoming a bottleneck in the overall quality of the user end ASIC. Current implementations employ a built-in self test (BIST) circuit external to the RAM structure. This implementation of an external BIST or design for test (DFT) mechanism, results in increase of the setup, hold and access times of the RAM. This creates the problem in timing estimation before the BIST insertion.

Figure 2:
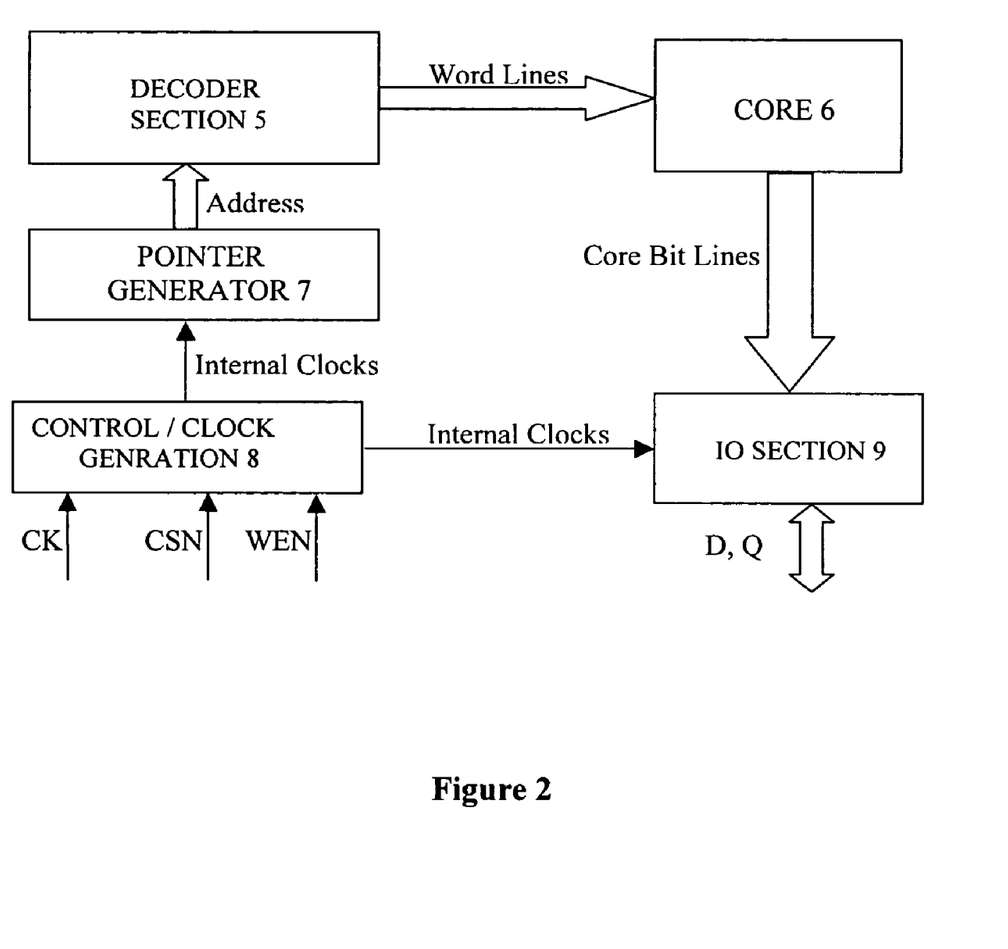
FIG. 2 shows a conventional register file memory.

A second type of memory structure known as a "register file" typically contains data input ports and address ports for writing, data output ports and address ports for reading (in case of FIFOs or stacks there are no address ports), an I/O section, decoders or counters, pipelines, clock generation circuits in case of self timed architecture and refresh logic. The block diagram of such a memory is shown in FIG. 2. The typical structure of these memories in addition to normal memories contains: 1. READ DECODER/COUNTERS; 2. WRITE DECODER/COUNTERS; 3. PRE DECODERS.

The normal decoder of the register file contains latches for the address and data inputs, write enable or read enable signals. In the case of FIFOs or LIFOs there are no address ports as the memory self-generates the addresses sequentially. In the case of address ports, addresses are statically or dynamically decoded and the valid decoded value is clocked to finally select a row or column (or both) to write onto or read from the respective cells. Dynamic decoders work in the similar fashion as described above with reference to single port memories.

The pointer generation in the register file memory is a complex operation. In the case of a FIFO there are generally two pointers, one is for read and the other is for write. At the beginning when there is no data in the FIFO, the position of the write pointer coincides with the position of read pointer. Once a write operation is performed, the write pointer marches ahead of the read pointer making space for the read pointer to move further. The FIFO becomes full when the write pointer comes exactly one location behind the read pointer. In this condition further write operation cannot be performed.

In some cases half full cases or half empty cases are also generated. To generate the Empty flag, the read pointer and the write pointer are compared to find equality. To generate the Full flag, the write pointer is compared to the read pointer to determine if the write pointer value is one less than the read pointer value. The major difficulty arises due to the fact that the clocks for the read and write pointers are normally different. In the aforesaid case, the flags act as synchronization signals for the two clock domains.

In case of LIFO, it is always the reverse. The read pointer always moves along with the write pointer when a write operation happens. Once a read operation happens, the write pointers as well as the read pointer both move backwards. The clocks for read and write cannot be different in case of a stack or some complex arrangement has to be made. Thus there are lots of complexities in designing such high speed and best in class register file memories.

Thus despite the fact that the aforesaid memories are high density, high speed, low power, they have the following disadvantages:

1. These memories cannot test themselves. They need a BIST or some other external circuit on chip or off chip to test them.

2. The fact that they are tested by some external means an increase the effort on the user end in terms of following: a. Place & Route; b. Timing Analysis before and after the test insertion; c. Clock management.

3. The routing congestion as well as placement constraint is sometimes painful for the person integrating the test with memory.

4. In case the user wants to achieve a particular speed for the integrated test to be able to perform an at-speed test, extra area is needed which also increases the routing congestion due to extra clock buffering and routing.

5. The test algorithms in the external test mechanism are most of the times coded to get the best fault coverage, based upon the fault model chosen upon various criteria like, Memory architecture, Process, Technology, Memory size etc. But as the process changes or matures, the need for a very exhaustive fault model decreases. Thus there must be a mechanism to alter the algorithm of the test mechanism.

6. Most of the time, external test patterns are needed to test the BIST or the test circuitry itself, before using it to test the other blocks. These tests are an additional cost over the existing set of test patterns, in terms of extra time as well as extra tester memory/register file.

7. Another thing is that these memories are present on chip in large numbers and sometimes are scattered around the chip. Thus sharing the test mechanism is a tedious job and it also increases routing congestion.

8. Another problem is that the size for which these memories are used are very small. Thus they are high speed as well as have very little area. Any test mechanism put dedicatedly for these memories is normally 200% to 800% the size of the memory itself. Although there are some serial test mechanisms which use scan registers to test the memories, but then a lot of time is taken to write and read in the memory through the scan chains as the scan chains on the SOC's are very long. Also the test cannot be a very high-speed test as serial scan chains are routed for a very low speed.

9. The test logic has to ensure the correctness of general functionality from all the ports as well as the at-speed functionality. The fault models, which are particular about the dual port operation, are Disturb faults, as well as memory cell stability tests.

10. The external test mechanism thus put does not increase the observability of the system pins, which are going to the register file.

There is accordingly a need in the art to provide a memory which solves the foregoing problems and addresses the above-mentioned disadvantages.

There is a need in the art for providing a register file, FIFO solution that solves the foregoing problems and addresses the above-mentioned disadvantages.

SUMMARY OF THE INVENTION

To address the foregoing drawbacks, embodiments of the present invention provide a highly optimized in-built testing mechanism in terms of area and speed, increase the system level testability, reset the whole memory core as well as initialize the memory with a known pattern, and reduce routing congestion.

In accordance with the present invention, there is lesser area overhead as compared to an external BIST since the test core added is full custom as well as the memory architecture is modified to achieve area and timing performance. The new architecture is aimed to a better access and cycle time and has a very little impact on address setup and hold with respect to clock. The power consumption is nearly the same as the prior art. Also the need for a sophisticated tester is eliminated as all the test patterns (including the self test) are generated within the chip itself or it can be done through a simple TAP or P1500 or some other serial or parallel interface.

In accordance with the present invention, there is a lesser area overhead as compared to an external BIST as the test core added is full custom as well as the register file architecture is modified to achieve area and timing performance. The new architecture is aimed to a better access and cycle time and has very little impact on address setup and hold with respect to clock. The power consumption is nearly the same as the prior art. Also the need for a sophisticated tester is eliminated as all the test patterns (including the self test) are generated with in the chip itself or it can be done through a simple TAP or P1500 or some other serial or parallel interface.

In accordance with the present invention, a high-speed memory architecture is provided which uses a built in structured DFT technique to test itself, thus reducing the effort of using BIST or any other DFT technique. Due to this technique the user is saved from putting extra efforts in timing analysis. The effort of BIST insertion is also reduced.

An embodiment of the instant invention provides a configurable memory architecture with built-in testing mechanism integrated in said memory comprising: a Memory Core for storing data; a Decoder Section connected to said Memory Core for decoding the addresses; an I/O Section connected to said Memory Core for bi-directional shifting of data; and a Control Block connected to said I/O Section and said Decoder Section for generating control signals and internal clock; wherein said I/O Section and said Control Block are enhanced to be configurable for built-in testing in test mode. The enhancement comprises: a configurable Serial Interface connected to said Control Block for shifting in and out test data and test status; a configurable Test Address Generator within said I/O Section connected to said Decoder Section having a plurality of Flip/Flops being configured using the latches present in said I/O Section; a configurable Test Pattern Generator within said I/O Section for generating test patterns on address and/or data lines during Test mode; a configurable Test Result Comparator in said I/O Section for comparing Memory data output with said test/expected data during Test mode; and a configurable Test Sequence Generator within said I/O Section connected to said Test Pattern Generator and Test Result Comparator for providing the verified result.

The architecture further includes a System Multiplexer within said I/O Section for multiplexing between the external address bus and internal test address bus.

The System Multiplexer is configured using tristate buffers.

The architecture further includes a Data Compressor connected to the System Multiplexer for compressing the data prior to forwarding to said Test Result Comparator.

The Data Compressor is a chain of logic gates.

The Decoder Section contains at least one decoder.

The Test Pattern Generator is an XOR gate.

One of said Test Patterns is a checkerboard data pattern.

The Test Pattern Generator is a Linear Feedback Shift Register.

The memory architecture is a single port memory.

The memory architecture is a multiple port memory.

The architecture further includes a Data Complexor within the I/O Section in a multi port memory configuration to synchronize test operations over multiple ports and perform simultaneous operations on the multi-port memory.

In the multi-port memory said Test Address Generator is the inherent Pointer Register logic.

The architecture further includes a Reset Section for resetting the data of said memory during test initialization.

A scan multiplexer is included for buses to increase the observability of the system.

A method for built-in testing of a configurable memory architecture comprises the steps of: storing data in a memory core; decoding the addresses in a decoder section; shifting data bi-directionally; and generating control signals. Generating comprises shifting in and out test data and providing test status; configuring Latches into Flip/Flops for generating addresses; generating test patterns for addresses during test mode; and comparing test data with test pattern for providing verified result.

In accordance with another embodiment, a memory testing system, comprises: means for generating memory addresses; means for generating test data written to the generated memory addresses; means for compressing data read from the memory addresses; and means for comparing a compressed data result to a known signature and generating a test failed output if the comparison fails.

In accordance with another embodiment, a memory testing method comprises: generating memory test addresses; generating test data to be written to the generated memory test addresses; compressing test data subsequently read from the memory test addresses; and comparing a compressed test data result to a known signature and generating a memory test failed output if the comparison fails.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

In the approach of making a memory in accordance with embodiments of the present invention, all the disadvantages related to test and initialization of the core of full custom memories, mentioned above have been addressed. From design to test, the current invention is a complete memory solution for a high-speed embedded RAM. It is a solution that has been designed while keeping the testing aspects in mind, thus resulting in an efficient architecture.

Figure 3:
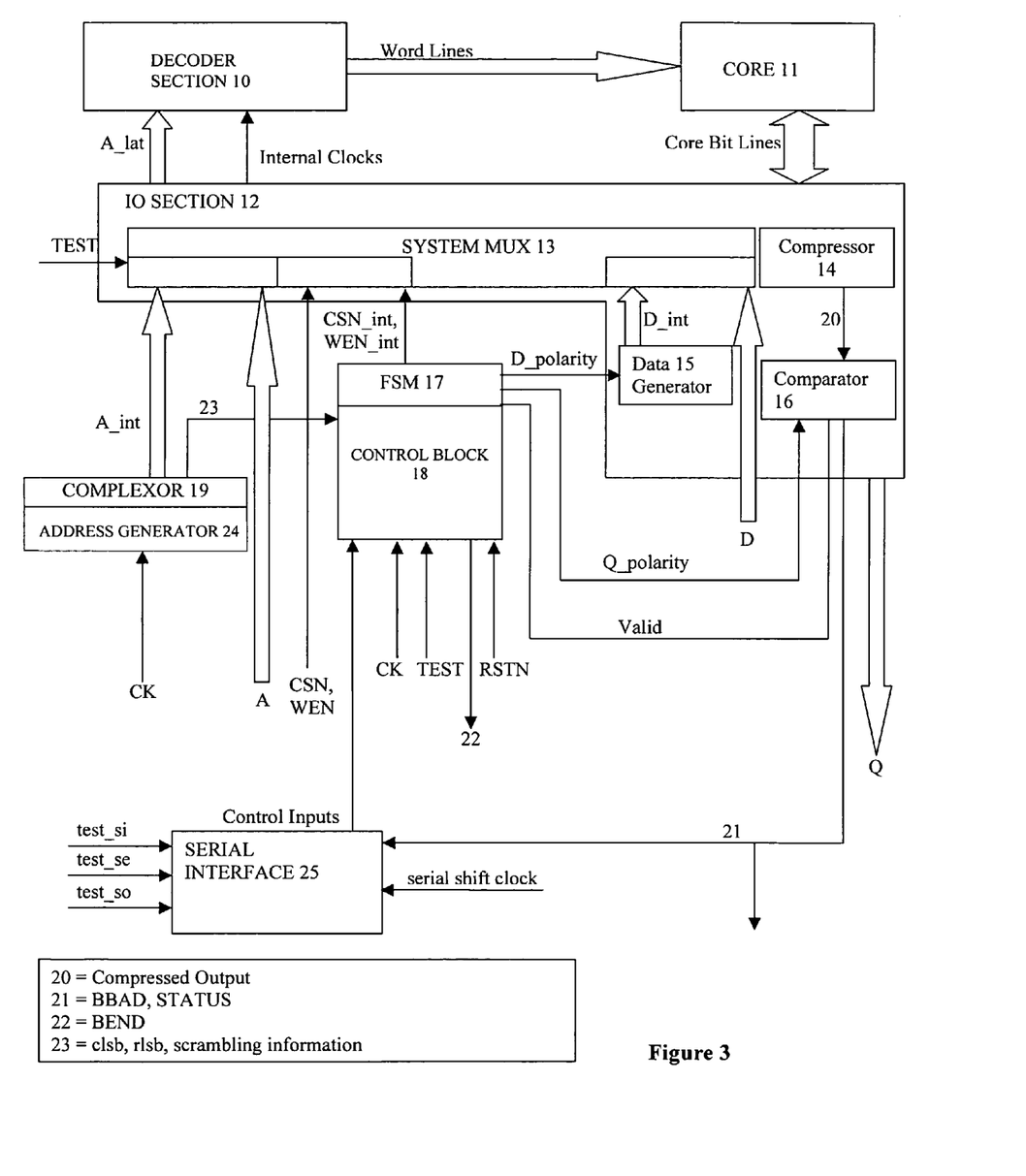
FIG. 3 shows the block diagram of the instant invention.

The interface of the novel architecture is shown in FIG. 3. There are test pins along with minimal hardware, which are added into the classical memory interface. Through the test pins TEST_SE, TEST_SI and TEST_SO the test inside the memory can be configured. The TEST pin is used to distinguish between the functional mode (transparent mode) and the test mode.

The connection of various sub-blocks can be adjusted according to the memory architecture. In the case where the memory has only one bank then, normally the address decoder as well as control unit of the memory are on one side of the memory. The address generator is put just below the address decoder to minimize the routing and connection overhead. This also makes the address generation operation faster as there are fewer interconnect delays. In case of a Paged memory architecture (DRAM), the compressor and the comparators can be put per page while the address generators, FSM 17 and other logic can be shared or duplicated for each page as per the speed needed.

FIG. 3 shows the block diagram of the instant invention. It shows various blocks namely System Multiplexer 13, Compressor 14, Data/Pattern Generator 15, Comparator 16, FSM 17, Complexor 19, Address Generator 24 and Serial Interface 25 being configured in I/O section 12 and Control Block 18. A Functional Description of the invention is as follows:

The data to be run is programmed in the Serial Interface 25. This data consists of information like, pattern type, number of operations, type of operations, address directions, linear feedback shift register (LFSR) seed etc., and is shifted at the serial clock speed, through serial inputs. The TEST pin is made high, to activate the finite state machine (FSM) 17. FSM 17 generates various controls for the other blocks based upon the control inputs from the Serial Interface 25. The Address Generator 24 generates the address, based upon FSM 17 controls and Serial Interface 25 controls like, initial address and final value, address direction, LFSR seed.

Data Generator 15 generates the data inputs based upon the FSM 17 controls and serial interface controls like data polarity, data background, scrambling information from the address generator, data pattern type etc. The control generator generates the controls based upon the FSM controls and serial interface controls like operations to be performed, read/write, memory to be selected or not and the required port to be activated. Complexor 19 creates differences between various port addresses in case a duplex operation or a multiplex operation is to be performed. The Compressor 14 compresses the memory output and Comparator 16 compares at each valid output data signaled by FSM 17. The result is either brought directly at the memory output or loaded in the Serial Interface 25. The System Multiplexer 13 selects the Memory functional inputs coming from the system or the test inputs generated from the embedded test circuitry. For a single test the Serial Interface 25 can be configured like above and then the embedded circuitry can run the test on the memory, and generate status for each test and pass it to the Serial Interface 25.

Figure 4:
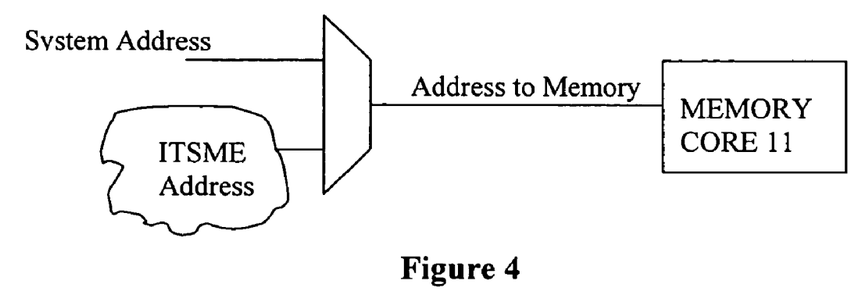
FIG. 4 shows the diagram of the system multiplexer.

Various sub blocks are explained below:

SYSTEM MUX 13: FIG. 4 shows the SYSTEM MUX 13 connected to the system pins and the test inputs for receiving the memory address and test address generated by the novel block. The enable signal for the multiplexer 26 is connected to the external TEST pin in the modified memory architecture.

A similar multiplexer configuration is used for the memory pins interacting with the system. These multiplexers are technology independent and a minimum number of the same is required as they result in additional delay in the setup time of the memory.

Serial Interface 25: The Serial Interface 25 is used to shift data in the test mode. The data to be shifted may include the type and the number of operations to be performed on each address, the seed of the Linear Feedback Shift Register (LFSR), the data to be written on the memory, the data pattern (checkerboard, stripes etc.), the memory section on which the test has to be run, etc. The shift clock can be any clock depending upon the usage and the environment. This block may be internal or external to the memory and can be shared between several memories. The information is shifted in serially at a very low clock speed.

Figure 5:
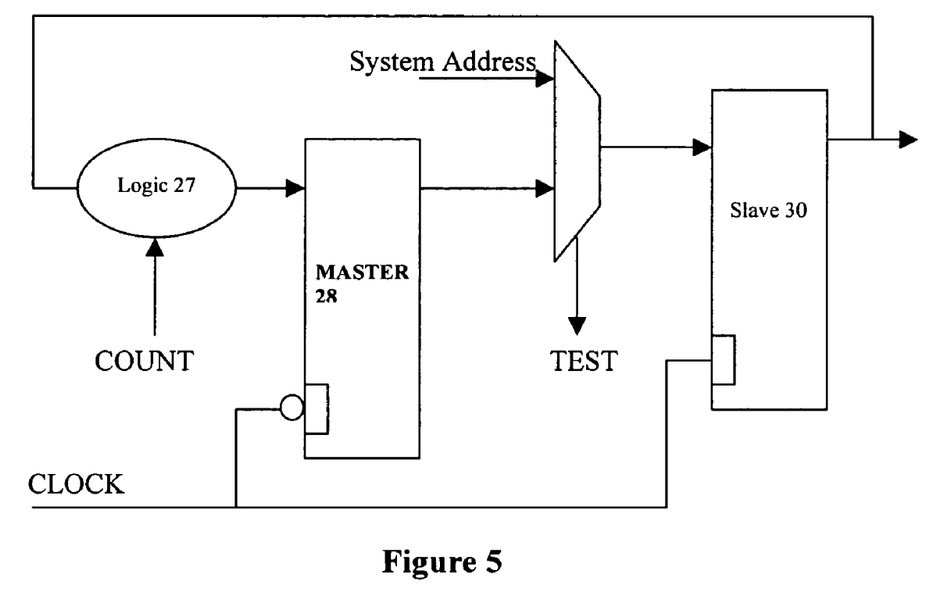
FIG. 5 shows the diagram of the address generator.

ADDGEN (Address Generator) 24: The Address Generator 24 is used for generating the test address for the memory. Deterministic, exhaustive or pseudo-random counters are used for address generation. Additionally, the Serial Interface 25 can be used to configure the Address Generator 24 to produce a particular sequence of addresses. This helps in detecting memory faults that are sequence dependent. Address Generator 24 can also be configured to produce a single address for writing galloping patterns etc. The arrangement for Address Generator 24 is illustrated in the FIG. 5. The Address Generator 24 provides additional test reliability as the Address Generator 24 is made using the memory latches already present inside the memory. In the test mode, the memory latch acts as a slave latch 30 and is combined using multiplexer 29 with the master latch 28 present in the test unit to form a scanable Flip-Flop. The output of the slave 30 is fed back to the master 28 through logic circuit 27. The system observability is increased by putting a scan multiplexer on the buses and signals coming from the system. Hence, this arrangement increases the testability of the memory and reduces the required area for the Address Generator 24. The same arrangement is used for the other pins like, write enable, read enable, data ports etc.

In case of a pointer based FIFO or a LIFO the generation of address is much easier and it is much relevant to test the memory using the pointer generation circuitry of the memory itself. The reason behind this is that pointers are generated normally in gray codes due to which the fault model of such a FIFO is different from a memory, which is counting in Binary Coded Decimal. The operation of a test sequence for one location may not be totally linked with the operation on the next location. But then testing with any other sequence will be irrelevant and it may lead to over testing or under testing. Using the pointer of the memory itself also saves a lot of area.

Figure 6:
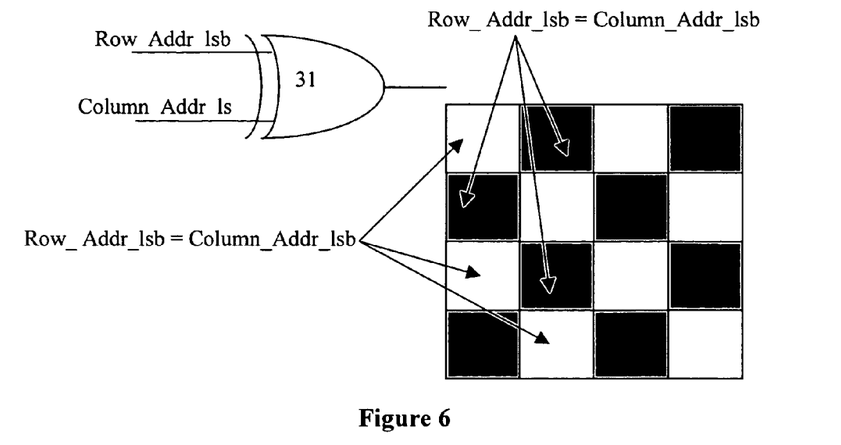
FIG. 6 shows the diagram of data generator and checkerboard.

DATAGEN (Data Generator) 15: The data generator generates the data based on the data polarity and sequence configured through the Serial Interface 25. Data patterns like a checkerboard and/or stripes have to be written in the memory in order to catch coupling and other faults in the memory. The Address Generator 24 is responsible for producing all test patterns for comprehensive testing of the memory. For instance, the generation of checkerboard pattern is done using a single XOR gate 31 for generic row column based memory as shown in FIG. 6. Some patterns like checkerboards produce electrical stress on the surrounding locations and are more helpful in testing memories like a DRAM where the coupling effects can alter the data. On the other hand, solid data patterns can be important for memories like an SRAM. For a data generation block, the data latch of the memory are turned into the Flip-Flops by adding a master latch to the address generator, thus resulting in a very high-speed memory test. Additionally, as these Flip-Flops are scannable they add observability on the input data pins from the memory.

Also during the memory bypass to improve the shadow logic, there is an asynchronous write through, which puts the data on D bus coming from the system on the Q output bus of the memory. Where the memory is Bit Write or has a mask port, the special patterns can be generated on the mask port of the memory in the same way as the data port. In the case of the bit write ports test it is possible to create a simultaneous read and write on the nearby locations, which can create disturb faults inside the memory. There is no other way of creating this kind of scenario in a single port memory.

CONGEN (Control Generator): The control generation block generates control signals for testing of the memory. These control signals include signals for read or write operations on the memory, reset signals for the memory state machine, disable control signal for the memory self time control, etc. These control signals are generated during the run time in the test mode. Similar to other blocks, the control latches are changed to flip-flops and hence, the observability is increased on the system pins. These control inputs are controlled through the FSM 17 (Finite State Machine).

In the case of register file memories, CONGEN controls the operation from all the ports in case of simultaneous operations. Also all the ports can have the same address on their address inputs but the control of operation is done through this port. In the case of a read through a port while writing, the CONGEN generates a signal, which stops the comparison of the output data, as the read operation is invalid. The CONGEN is programmed though the Serial Interface 25 for any control generation.

FSM (Finite State Machine) 17: The FSM 17 is responsible for controlling all activities for the test device. On receiving a high signal at the TEST pin, the FSM 17 block resets and initializes all the registers in other blocks of the test device. Additionally, setting TEST enable pin low synchronously resets the FSM 17 to an initial state in next clock cycle. To attain the maximum operation speed, the FSM 17 is designed in a gray code (two neighbor states differ by only one bit). The states in the State machine are n bits wide where n depends on the number of address sequences tested in one run. The value and type of the sequences run on the memory are configured through the Serial Interface 25 serially. The FSM 17 is only responsible for counting the number of such sequences and responsible for activating or deactivating each block in the ITSME device by controlling the control generator for generating various control signals. An external signal called BEND is set high after all the test sequences have been applied on the memory. This is an indication that the configured series of sequences have been applied and further tests can be carried by configuring new sequences.

COMPRESSOR 14: The Compressor 14 is used for compressing the data before comparison to reduce the size of the comparator. For the patterns generated through an LFSR the Compressor 14 can be as simple as a Multiple Input Signature Register (MISR), which compresses the output to a known signature configured through the Serial Interface 25. The MISRs are also made by changing the memory output latch to a Flip-Flop in the self-test mode. A MISR polynomial compresses the selected data bit outputs to a single signature. The MISR polynomial is configurable and is chosen based on the data bit length for the test purpose, which can also be configured through Serial Interface 25. Thus different types of debugging are also possible by configuring a suitable MISR polynomial. For deterministic data, the compression circuit is made very small making it more suitable for the memories where test algorithms are mostly deterministic. Thus the data output either consists of a checkerboard or a solid pattern or a known repeated patterns. These are first compressed to all zeros or all ones, by using NAND-NOR chains (see FIG. 7). Different techniques and logics can be used but at the end all the data outputs are compressed to a single bit, which is compared with the expected data bit. The different compressors are used based on the memory floor plan and architecture. To save area, the compressors can be shared between various pages of the memory as well.

Figure 7:
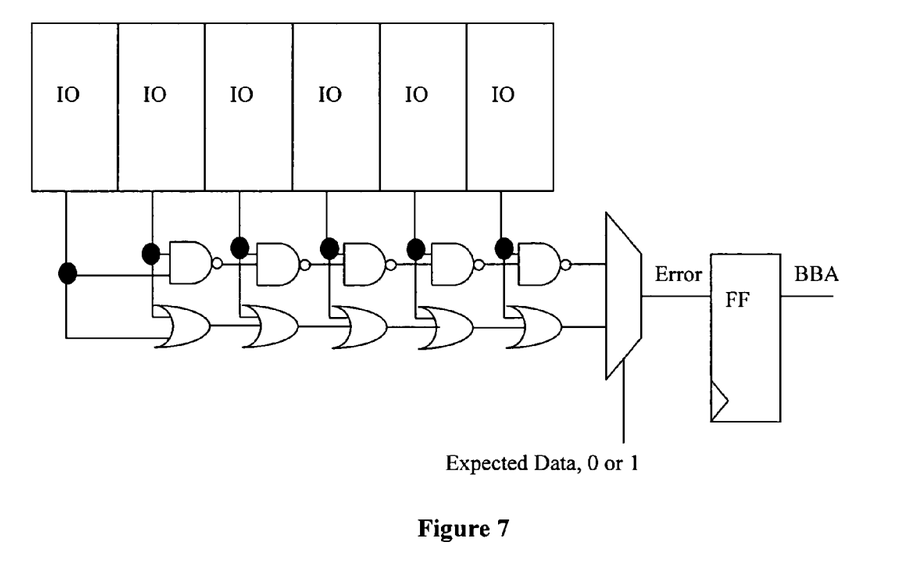
FIG. 7 shows the diagram of compressor along with the comparator.

COMPARATOR 16: The Comparator 16 compares the compressed data, either a signature or a deterministic set of bits, with a golden signature or known data, which is received from the Serial Interface 25. The signature comparison normally happens at the end of a test run, but the deterministic data comparison can happen on every cycle. Thus the FSM 17 provides the expected data on each clock cycle, which is configured through the Serial Interface 25. In this case, a dynamic comparison is done on each clock cycle and in case of a mismatch, the BBAD pin goes high for one clock cycle. At the end of the test if a fault has occurred, then the BBAD pin remains high to signify that the memory is faulty. The schematic of a generic Compressor 14 and Comparator 16 is shown in FIG. 7. The figure illustrates the case where the memory is filled with either all zeros or all ones. In case of a checkerboard pattern the output Q bus is still all zeroes or all ones and comparison is easily done using a NAND-OR chain. If the Q output bus itself has a checkerboard or repeated patterns, then NAND-OR blocks can be used for all odd bits and even bits separately without putting any extra logic. Hence, the Compressor 14 logic does not increase based on the complexity of the repeated data background.

For a pseudo-random pattern, the pattern itself is given on the D system bus and the expected data is generated by XORing the pattern present on the D input bus of the memory, with Q output bus to produce all zeros or all ones. After this, compression is done to get a single bit in the same manner. This method involves putting a particular pattern on the D bus, which can increase the testing time by shifting the D patterns on the D bus. This type of pattern (galloping) is good for debugging purposes.

URM (Unit for RESET Management): A good testable device always has a proper mechanism for initialization of all blocks on the device. All the sequential devices on a chip must be resetable and must contain known data on all blocks before test. To achieve this inside the architecture has a dedicated unit called Unit for reset management (URM). This unit is used for asynchronous Reset/Preset of the full memory including all the flip-flops, latches and the core of the memory through a Reset pin (active low). It is also used to initialize the memory with checkerboard pattern or a known pattern present on the D bus.

Figure 8:
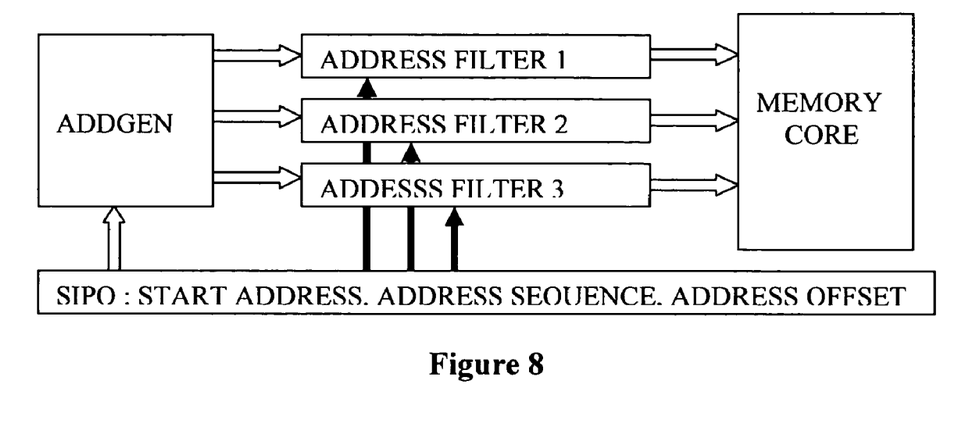
FIG. 8 shows the diagram of Complexor.

COMPLEXOR 19: This block is used primarily with the register file memories. The Complexor 19 is used to synchronize patterns in case of a simultaneous operation on nearby locations, more than one port. This is done to test the memory for the faults, which occur during functional run. Also these types of operations create a stress on the register file memories which are called disturb faults. The patterns, which are created, are called concurrent patterns. FIG. 8 shows the two basic parts of the Complexor 19 namely Address Filter and Qpolarity Filter.

The Address Filter generates addresses of various ports based upon the configuration. For example, if there are three ports (two read and one write), then there can be nine possible arrangements of the ports in terms of their start addresses, which can be easily calculated, based upon the permutation/combination. The sequence of the ports can be calculated based upon the difference of the port address from the first port address. Though this leads to duplicity but it reduces a lot of area, as this information is low speed information. To program the nine address sequences one needs four bits. The difference between one port and the other port should not be greater than a programmed value, which is normally 1 to get better coverage, but it can be at most 2. Thus to tell the difference one can have two bits per port as there are three ports and the maximum value can be four. Thus by programming only six bits one can generate the address using the address filter block. There is one address filter per port.

Figure 9:
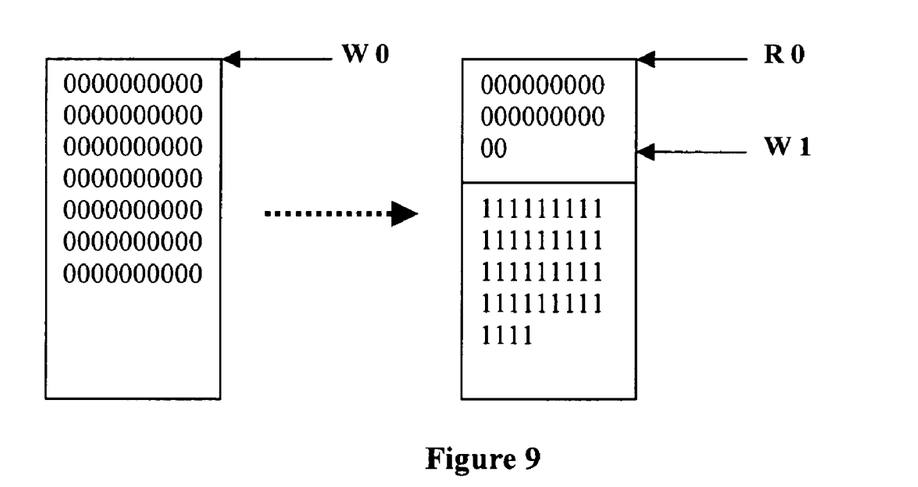
FIG. 9 shows the complex pattern generated by the Qpolarity filter.

The Q_polarity Filter is needed as the address ports run in a rotation. When there is a difference between the port addresses, all the ports count the same number of addresses. The q_polarity is the polarity of data written previously on a location or in some previous clock cycle. This is the data expected on that location. The only complexity arises when the read operation takes place on an address when a write operation with a different polarity than expected has happened in the current test algorithm run. The polarity correction has to be done in this case. It is important to note that the polarity correction is only needed when the polarity of expected read is different from the write data polarity happening in the current test algorithm. For example, there is one write port and one read port there is a difference of two addresses in both the ports. Also lets assume that write port is ahead of read port. The write port is writing one on all the locations as well as the previous written pattern was zero. Thus the q_polarity will be zero for the first two locations while one for the rest of the locations as shown in FIG. 9. The q_polarity filter thus generates a complex expected data based upon the port difference and port sequence coming from the Serial Interface 25 block.

To conclude, the solution provided through ITSME strategy is a solution worth using inside the embedded memories whether they are asynchronous or synchronous, static or dynamic, soft or hard. The key point of this invention is that it treats the memory not as a macro but moves inside to see the things in detail. Also by this approach one need not put an external BIST in side chip to test the memory. The area is of course better and hence the timings also. Testability is increased and the full memory is no more a black box. Only the core, which is treated, as black box is isolated during test.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A configurable memory architecture with built-in testing mechanism integrated in said memory comprising:
    a Memory Core for storing data;
    a Decoder Section connected to said Memory Core for decoding addresses;
    an I/O Section connected to said Memory Core for bi-directional shifting of data; and
    a Control Block connected to said I/O Section and said Decoder Section for generating control signals and an internal clock;
    wherein said I/O Section and said Control Block are enhanced to be configurable for built-in testing in test mode comprising:
        a configurable Serial Interface connected to said Control Block for shifting in and out test data and test status;
        a configurable Test Address Generator within said I/O Section connected to said Decoder Section;
        a configurable Test Pattern Generator within said I/O Section for generating test patterns on address and/or data lines during Test mode;
        a Data Compressor for compressing Memory data output, the Data Compressor comprising a series chain of AND gates each gate receiving a bit of Memory data and a series chain of OR gates each gate receiving a bit of Memory data;
        a configurable Test Result Comparator in said I/O Section comprising a multiplexer receiving outputs of the series chain of AND gates and series chain of OR gates, the multiplexer operating to multiplex the received outputs with expected test data during Test mode to output a verified result.

2. The configurable memory architecture as claimed in claim 1 further including a System Multiplexer within said I/O Section for multiplexing between an external address bus and an internal test address bus.

3. The configurable memory architecture as claimed in claim 2 wherein said System Multiplexer is configured using tristate buffers.

4. The configurable memory architecture as claimed in claim 1 wherein the Data Compressor is connected to the System Multiplexer for compressing the data prior to forwarding to said Test Result Comparator.

5. The configurable memory architecture as claimed in claim 4 wherein said Decoder Section contains at least one decoder.

6. The configurable memory architecture as claimed in claim 4 further including a Data Complexor within the I/O Section in a multi port memory configuration to synchronize test operations over multiple ports and perform simultaneous operations on the multi-port memory.

7. The configurable memory architecture as claimed in claim 1 wherein said Test Pattern Generator is an XOR gate.

8. The configurable memory architecture as claimed in claim 1 wherein one of said Test Patterns is a checkerboard data pattern.

9. The configurable memory architecture as claimed in claim 1 wherein said Test Pattern Generator is a Linear Feedback Shift Register.

10. The configurable memory architecture as claimed in claim 1 wherein said memory architecture is a single port memory.

11. The configurable memory architecture as claimed in claim 1 wherein said memory architecture is a multiple port memory.

12. The configurable memory architecture as claimed in claim 1 wherein, in a multi-port memory, said Test Address Generator is the inherent Pointer Register logic.

13. The configurable memory architecture as claimed in claim 1 further including a Reset Section for resetting the data of said memory during test initialization.

14. The configurable memory architecture as claimed in claim 1 wherein scan multiplexer is included to buses to increase the observability of the system.

15. A memory testing system, comprising:
means for generating memory test addresses;
means for generating test data to be written to the generated memory test addresses;
means for compressing test data subsequently read from the memory test addresses, the means for compressing comprising a series chain of AND gates each gate receiving a bit of read test data and a series chain of OR gates each gate receiving a bit of read test data; and
means for comparing a compressed test data result to a known signature and generating a memory test failed output if the comparison fails, the means for comparing comprising a multiplexer receiving outputs of the series chain of AND gates and series chain of OR gates, the multiplexer operating to multiplex the received outputs with the known signature.

16. The system of claim 15 wherein the memory is a multiple port memory, and wherein the means for generating memory addresses includes a complexor functionality operable to create differences in port addresses.

17. The system of claim 15 wherein the means for generating test data comprises a circuit, responsive to control selection, operable to generate test data in a control selection specified pattern.

18. The system of claim 15 wherein the series chain comprises circuitry for compressing a multi-bit test data as read from the memory test addresses to a single compressed bit.

19. The system of claim 15 wherein the multiplexer comprises multiplexed inputs receiving outputs of the series chain of AND gates and series chain of OR gates and a control selection input receiving the known signature.

20. The system of claim 15 wherein the means for compressing test data comprises circuitry for compressing a multi-bit test data as read from the memory test addresses to a fewer bit signal for comparison to the signature.

21. The system of claim 20 wherein the fewer bit signal is a single bit signal and the known signature is a single bit signature.

22. The system of claim 15 wherein the known signature is derived from the test data to be written to the generated memory test addresses.

23. A memory testing system comprising:
means for generating memory test addresses;
means for generating test data to be written to the generated memory test addresses;
means for compressing test data subsequently read from the memory test addresses wherein the means for compressing comprises a first NAND chain logic circuit operable to receive and logically combine the multi-bit test data to generate a first signal and a second NOR chain logic circuit operable to receive and logically combine the same multi-bit test data to generate a second signal; and
means for comparing a compressed test data result to a known signature and generating a memory test failed output if the comparison fails, the means for comparing comprising a multiplexer receiving the first and second signals, the multiplexer operating to multiplex the first and second signals with the known signature applied to a control input of the multiplexer.

24. A memory testing method, comprising:
generating memory test addresses;
generating test data to be written to the generated memory test addresses;
compressing test data subsequently read from the memory test addresses, wherein compressing comprises serially AND-ing bits of read test data and serially OR-ing bits of read test data; and
comparing a compressed test data result to a known signature and generating a memory test failed output if the comparison fails, wherein comparing comprises multiplexing a result of the serial AND-ing and a result of the serial OR-ing with the known signature.

25. The method of claim 24 wherein compressing test data comprises compressing a multi-bit test data as read from the memory test addresses to a single compressed bit for comparison to a single bit signature.

26. The method of claim 24 wherein compressing test data comprises compressing a multi-bit test data as read from the memory test addresses to a fewer bit signal for comparison to the signature.

27. The method of claim 24 wherein the known signature is derived from the test data to be written to the generated memory test addresses.

* * * * *

UNITED STATES PATENT AND TRADEMARK OFFICE
CERTIFICATE OF CORRECTION

PATENT NO.       : 7,603,603 B2  
APPLICATION NO.  : 11/441815  
DATED            : October 13, 2009  
INVENTOR(S)      : Prashant Dubey It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 570 days.

Signed and Sealed this

Fifth Day of October, 2010

David J. Kappos  
*Director of the United States Patent and Trademark Office*